United States Patent [19]

Barber et al.

[11] Patent Number: 4,814,290

[45] Date of Patent: Mar. 21, 1989

[54] METHOD FOR PROVIDING INCREASED DOPANT CONCENTRATION IN SELECTED REGIONS OF SEMICONDUCTOR DEVICES

[75] Inventors: Jeffrey R. Barber, Pittsburgh, Pa.; Harish N. Kotecha, Manassas, Va.; David D. Meyer, Oakton, Va.; David Stanasolovich, Manassas, Va.

[73] Assignee: International Business Machines Corporation, Armonk, N.Y.

[21] Appl. No.: 114,933

[22] Filed: Oct. 30, 1987

[51] Int. Cl.[4] .................................... H01L 21/302
[52] U.S. Cl. ................................ 437/70; 437/69; 437/75; 437/160; 437/164; 437/239; 437/956; 437/948
[58] Field of Search .............. 437/69, 70, 75, 160, 437/164, 239, 956, 948

[56] References Cited

U.S. PATENT DOCUMENTS

| | | |
|---|---|---|
| 3,751,722 | 8/1973 | Richman . |
| 4,373,965 | 2/1983 | Smigelski . |
| 4,376,336 | 3/1983 | Endo et al. . |
| 4,404,579 | 9/1983 | Leuschner . |
| 4,521,952 | 6/1985 | Riseman . |
| 4,561,172 | 12/1985 | Slawinski et al. ............... 437/31 |
| 4,569,117 | 2/1986 | Baglee et al. .................. 437/26 |
| 4,577,394 | 3/1986 | Peel ................................ 437/70 |

FOREIGN PATENT DOCUMENTS

| | | | |
|---|---|---|---|
| 0116185 | of 1979 | Japan ........................ 437/70 |
| 0121684 | of 1979 | Japan ........................ 437/70 |
| 0042987 | of 1979 | Japan ........................ 437/70 |
| 0137650 | of 1981 | Japan ........................ 437/70 |
| 58-40839 | of 1983 | Japan ........................ 437/70 |
| 0165434 | of 1984 | Japan ........................ 437/70 |
| 0224141 | of 1984 | Japan ........................ 437/70 |
| 0048404 | of 1984 | United Kingdom .......... 437/70 |

OTHER PUBLICATIONS

IBM Technical Disclosure Bulletin, vol. 27, No. 6, Nov. 1984, "Method For Forming Laterally Graded Fet Junctions".

Primary Examiner—Brian E. Hearn
Assistant Examiner—Beverly A. Pawlikowski
Attorney, Agent, or Firm—Jesse L. Abzug; Joseph C. Redmond, Jr.

[57] ABSTRACT

A method for providing increased dopant concentration in selected regions of semiconductors by providing field implant dopant in the transition region located below the "bird's beak" region and between the field and active regions of a semiconductor. The method comprises the steps of: forming a thin insulating layer on the surface of a semiconductor substrate; depositing a thin anti-oxidant layer on the insulating layer; depositing a layer of photoresist on the anti-oxidant layer; selectively etching the anti-oxidant layer; ion-implanting the field region of the semiconductor substrate; providing spacers on the sides of the anti-oxidant layer; and oxidizing the semiconductor substrate.

17 Claims, 2 Drawing Sheets

METHOD FOR PROVIDING INCREASED DOPANT CONCENTRATION IN SELECTED REGIONS OF SEMICONDUCTOR DEVICES

DESCRIPTION

1. Technical Field

The invention relates in general to a method for providing increased dopant concentration in selected regions of a semiconductor device and, more particularly, to a method for eliminating radiation-induced voltage shifts in the area located under the "bird's beak" region and between the field implant and active regions of a semiconductor device.

2. Prior Art

The advent in recent years of space exploration has created a substantial demand for space-compatible semiconductor devices. In particular, field effect transistor (FET) devices are needed to support this burgeoning field of technology. One of the present problems facing manufacturers of such semiconductor devices is that the relatively large amount of stray radiation found in space adversely affects circuit operation by inducing voltage shifts in the semiconductor.

More specifically, if any region of the semiconductor is not adequately protected from stray radiation, for example, by insulators, field implants or the like, the threshold voltage in the inadequately protected region will be decreased in proportion to the total dose of radiation at the region. A low threshold voltage in any region of the semiconductor will make that region susceptible to voltage shifts. This phenomenon of radiation-induced voltage shifts is most pronounced in space because of the presence of relatively large amounts of stray radiation.

Manufacturers have employed various state-of-the art fabrication processes in an effort to combat the effects of radiation on semiconductors. The following are examples of such processes:

U.S. Pat. No. 4,521,952 to Riseman discloses a method for making integrated circuits which uses metal silicide contacts and which includes the step of using a side wall insulator consisting of silicon dioxide or silicon nitride.

U.S. Pat. No. 4,569,117 to Baglee et al discloses a method for producing a field transistor having a high threshold voltage. The field oxide is grown under a pressurized oxygen atmosphere, and a moderate level of P+ implant is used to obtain the high threshold voltage.

IBM Technical Disclosure Bulletin Vol. 27, No. 6, Nov. 1987, pages 3439–3442, in an article by B. El-Kareh and W.P. Noble, Jr., discloses a method for fabricating laterally graded FET junctions. Arsenic-doped oxide spacers are formed on the vertical side walls of a polysilicon gate to reduce leakage current to the substrate and to increase threshold voltage stability. During the step of implantation, the spacers diffuse arsenic into the substrate to form lightly doped n regions.

U.S. Pat. No. 4,376,336 to Endo et al discloses a method for forming a field insulator film around an element region. A polycrystalline silicon layer is formed over a silicon nitride film and is then etched in a direction perpendicular to the surface so that the layer remains around the sides of the nitride film. Boron is then ion-implanted by using the silicon nitride film and the silicon layer as a mask to form a field inversion-preventive layer in the substrate.

U.S. Pat. No. 4,373,965 to Smigelski discloses a process for eliminating parasitic side wall transistor action associated with LOCOS isolation oxide structures. Thin layers of silicon dioxide and silicon nitride are deposited over a silicon substrate. A thick layer of silicon dioxide is then deposited to form windows such that those in the thick layer of silicon dioxide are wider than those in the thin layers. The thin layers of silicon dioxide and silicon nitride are deposited on the substrate with a selected thickness such that, when ion-implantation is performed, the thin layers do not act as masks. Following the steps of implantation and oxidation, a resultant impurity layer is formed which spans the length of the "bird's beak" region.

U.S. Pat. No. 4,404,579 to Leuschner discloses providing a spacer region to reduce the capacitance between the channel stop region and the active region of a semiconductor device.

U.S. Pat. No. 4,577,394 to Peel discloses a method for reducing the encroachment of a field oxide layer which is grown during the fabrication of a MOS device. A layer of phosphorous-doped glass is heated so that the glass becomes partially molten and flows over the edges of an anti-oxidant material layer of silicon nitride, thereby forming skirts. During the implantation step, the skirts block the ion beams and keep the edges of the field implant region spaced laterally outward from the edges of the anti-oxidant layer.

Many of the above methods and various other methods are presently being used to reduce the effects of radiation on semiconductors. In particular, radiation-induced voltage shifts originating in the field region of a semiconductor have successfully been contained by using various types of insulators, high concentration field implants and low temperature processing. In addition, voltage shifts originating in the active region of the semiconductor have effectively been contained by using low temperature processing techniques and by making the insulator in this region relatively thin.

However, none of the present fabrication methods has effectively and efficiently been employed to prevent voltage shifts in the transition region located under the "bird's beak" region and between the active and field regions of the semiconductor.

Under present fabrication methods, silicon nitride-silicon dioxide masks are used as oxidation masks to provide semiconductor devices with electrical isolation and with adjacent substrate regions. in these existing methods, lateral growth of oxide located beneath these masks produces laterally sloping profiles commonly referred to as "bird's beaks". These sloping profiles cause poorly defined edges at the transition region of the semiconductor, thereby making that region susceptible to radiation- induced voltage shifts. In particular, as a result of the sloping profiles and of lateral diffusion of field implant during the growth of the oxide, a relatively small amount of field implant dopant is formed at the transition region. Because this transition region has a low concentration of field implant, when the region is irradiated, the threshold voltage in the region is lowered, thereby causing voltage shifts.

Therefore, there remains a continuing need in the semiconductor fabrication art for a method which prevents radiation-induced voltage shifts in the transition region of a semiconductor and which, preferably, utilizes existing processing techniques so that the method can be easily implemented. Furthermore, there is a need for a method of producing radiation-immune semiconductors and which does not introduce complex techniques into the existing processes.

SUMMARY OF THE INVENTION

Thus, an object of the present invention is to provide an improved method for producing a radiation-immune semiconductor device.

Another object of the invention to provide a method for producing a radiation-immune semiconductor device and which is easily implemented with existing state-of-the art processes.

Still another object of the invention is to provide a method for producing a radiation-immune semiconductor device and which does not introduce complex techniques into existing processes.

These and other objects of the invention are realized in the method of the present invention for eliminating radiation-induced voltage shifts in the transition region of a semiconductor device. The inventive method includes the following step: forming a thin insulating layer over the surface of a semiconductor substrate, forming a thin oxidation mask or anti-oxidant layer on the insulating layer, depositing a photoresist layer on the anti-oxidant layer, etching the anti-oxidant layer by using the photoresist layer as a mask, ion-implanting the field region of the device, providing spacers on the sides of the anti-oxidant layer and oxidizing the semiconductor substrate.

DETAILED DESCRIPTION OF THE INVENTION

Figure 1:
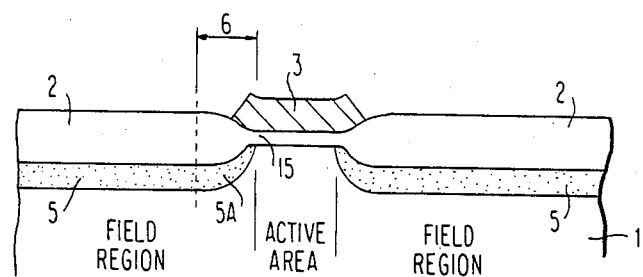
FIG. 1 is a sectional view of a prior art semiconductor fabricated by using existing state-of-the-art methods.

In FIG. 1 there is shown a semiconductor structure fabricated according to prior art methods. The semiconductor structure consists of a silicon substrate 1, a layer 2 of silicon dioxide overlying the substrate, and a layer 3 of anti-oxidant layer overlying the silicon dioxide layer 2 at the active area or region of the structure. The silicon substrate 1 contains a field region 5 which was implanted into the substrate through that portion of silicon dioxide layer 2 not masked by the anti-oxidant layer 3. The transition region 6, which is shown as that region below the "bird's beak" region 15 and between the field and active regions of the semiconductor, has a relatively low concentration of dopant 5A in comparison to the concentration of dopant at the field implant region 5. The low level of dopant at the transition region is attributed to lateral diffusion of the field implant during the substrate oxidation step. When the transition region 6 is exposed to radiation, the voltage threshold in the region is lowered in proportion to the total dose of radiation at the region. The lowered voltage threshold makes the region 6 vulnerable to voltage shifts which cause current leakage.

In FIGS. 2A through 2E, there are shown, in sequential order, the steps of the fabrication method of the present invention which provide additional dopant at the transition region, thereby overcoming the problem of voltage shifts in the prior art devices. While FIGS. 2A through 2E and the accompanying description show and describe a single active element on a semiconductor substrate, it should be understood that a number of active elements are produced on a single substrate. In addition, while the drawing figures and description thereof are principally directed to the fabrication of a MOS device, it should be understood that the method of the present invention may be employed in the fabrication of CMOS, NMOS and other semiconductor devices. Corresponding regions shown in FIG. 1 and in FIGS. 2A-2E are identified by the same reference numerals.

Figure 2A:
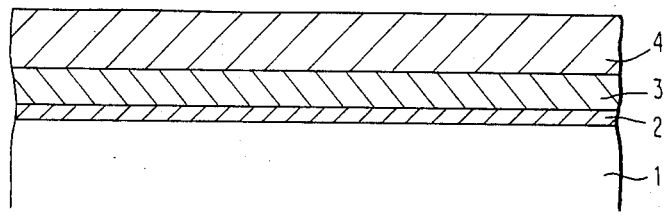
FIGS. 2A through 2E are sectional views showing, in sequential order, the steps of a preferred embodiment of the method of the present invention.

In FIG. 2A, a semiconductor substrate 1, consisting of silicon, is initially cleaned. A thin silicon oxide layer or film 2 is formed over the surface of the substrate by thermal oxidation to a thickness of about 40 nanometers. This oxide layer is formed, for example, by exposing the silicon substrate 1 to oxygen at a high temperature to convert the surface thereof to silicon oxide. The oxide layer 2 is then covered with a thin layer of anti-oxidant or oxidation mask 3. The thin oxide layer or film 2 was chosen to have a thickness of about 40 nanometers in order to position the oxidation mask layer 3 relatively close to the substrate, thereby limiting the growth of the "bird's beak" region in subsequent steps of the inventive method. Those skilled in the art will appreciate that, although it is desirable to form the anti-oxidant or oxidation mask layer 3 as close as possible to the substrate, the oxide layer 2 is required since an impermissible amount of stress would be produced on the substrate if the substrate were in direct contact with the oxidation mask layer 3.

The anti-oxidant layer 3 preferably consists of silicon nitride, which is deposited to a thickness of approximately 100 nanometers. A layer of photoresist 4 is then deposited on the silicon nitride layer 3 to a thickness of from 1,000 to 1,500 nanometers.

Figure 2B:
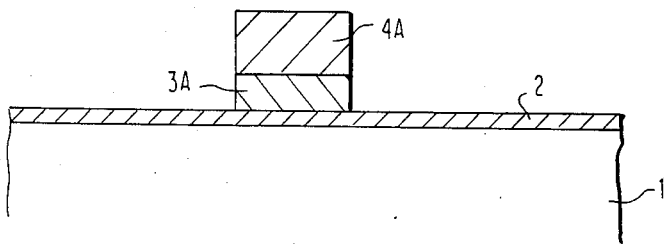
Figure 2C:
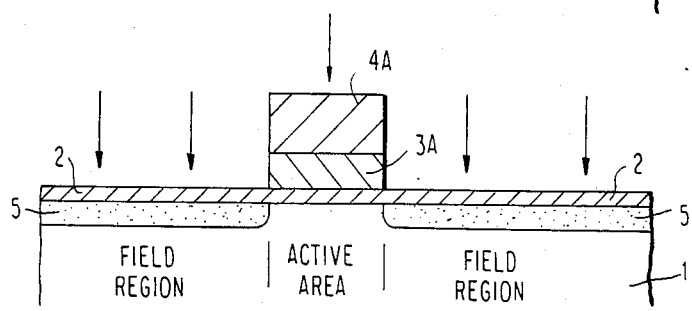
Figure 2D:
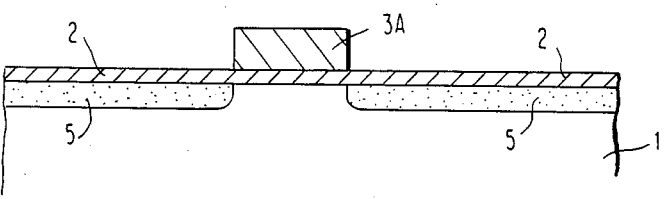

After the formation of a pattern mask in the photoresist layer 4, using a photolithographic process, the silicon nitride layer 3 is then etched to achieve the structure shown in FIG. 2B. In FIG. 2B, the pattern mask, consisting of the etched photoresist layer 4A and silicon nitride layer 3A, defines the active area or region of the surface of substrate 1 in which the source, drain and channel regions of a MOSFET device will alter be formed. As shown in FIG. 2C, after this active region of the semiconductor is defined, boron is implanted (represented by the downward-pointing arrows) through a portion of the silicon dioxide layer 2. More particularly, boron is implanted into the substrate 1 through that portion of the silicon dioxide layer not masked by the pattern mask of silicon nitride layer 3A and the photoresist layer 4A. The boron is implanted to a concentration of between $1 \times 10^{12}$ and $1 \times 10^{14}$ ions/cm$^2$, and at an accelerating voltage of about 40 KeV. The implantation of boron forms the field implant regions 5 on either side of the pattern mask. The etched photoresist layer 4A is then removed from the etched silicon nitride layer 3A to produce in the structure of FIG. 2D.

Figure 2E:
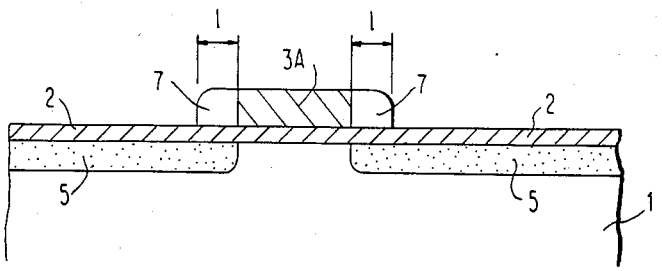

Following the removal of etched photoresist layer 4A, a layer (not shown) of silicon nitride spacer material is deposited over the etched silicon nitride layer 3A and that portion of silicon oxide layer 2 not masked by nitride layer 3A. The layer of silicon nitride spacer material is then ansiotropically etched, by conventional methods, to form the structure as shown in FIG. 2E and which includes silicon nitride spacers 7 which were left on the side walls of etched silicon nitride layer 3A. Each of these spacers 7 is between 0.05 and 0.075 micrometers in length 1. The spacers 7 increase the length of the etched silicon nitride layer by 0.1 to 0.15 micrometers (2×0.05 or 2×0.075). More important, the spacers 7 have the effect of providing field implant under the enlarged silicon nitride layer since the silicon nitride spacers 7 overlap the field implant regions 5.

Figure 3:
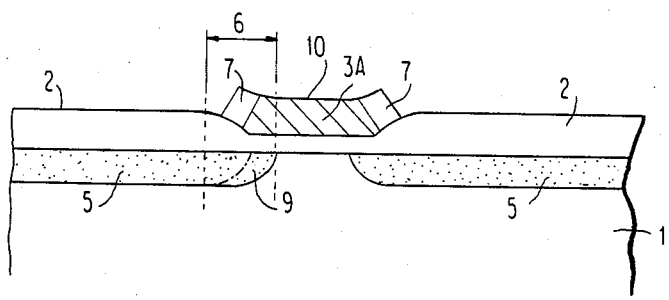
FIG. 3 is a sectional view of the resulting semiconductor structure produced by the method of the present invention.

After the formation of spacers 7, substrate 1 is then oxidized, by conventional methods, to form the structure of FIG. 3. In FIG. 3, the transition region 6 is shown to have a higher concentration 9 of field implant 9 than that of the prior art structure of FIG. 1. More specifically, the effects of lateral diffusion of the field implant during substrate oxidation are minimized by using spacers 7. The length of the spacers which is added to the etched silicon nitride layer 3A reduces the effects of lateral diffusion during substrate oxidation since a longer anti-oxidant layer 10, including etched silicon nitride layer 3A and silicon nitride spacers 7, was formed prior to substrate oxidation. Thus, under the method of the present invention, the transition region of the semiconductor is provided with sufficient field implant to eliminate the region's susceptibility to radiation-induced voltage shifts.

Figure 4:
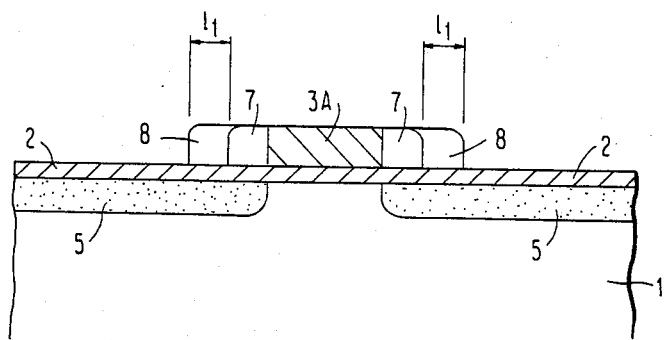
FIG. 4 is a sectional view showing the step of adding second spacers according to an embodiment of the present invention.

As shown in FIG. 4, in a second embodiment of the invention, following the formation of spacers 7, a second set of spacers 8 is formed. A second layer (not shown) of silicon nitride spacer material is deposited over the etched nitride layer 3A, spacers 7 and that portion of oxide layer 2 not covered by layer 3A or spacers 7. This second layer of silicon nitride spacer material is then ansiotropically etched to form second spacers 8 each of which is between 0.05 and 0.075 micrometers in length $1_1$. Spacers 8 have the effect of providing even more field implant 5 under the existing silicon nitride layer, consisting of nitride layer 3A and spacers 7, since the second spacers 8 also overlap field implant regions 5. Upon substrate oxidation, the effects of lateral diffusion of field implant are further diminished, and the transition region 6 is further assured to have a sufficient concentration of field implant. The second set of spacers 8 was separately formed, rather than merely increasing the length of the first spacers 7 during the etching of the first layer of spacer material, because, if the length of any of the spacers exceeds more than about 0.075 micrometers each, the spacers will tend to crack from stress and/or deform the substrate upon substrate oxidation. However, the formation of a second set of spacers 8 in the above manner maintained adequate stability upon substrate oxidation.

In a third embodiment of the present invention, spacers 7 and/or 8 of the above embodiments are formed from a doped oxide spacer material, such as a boron-doped, oxide to provide additional dopant in the transition region. More specifically, after the doped oxide spacer material is etched, the resulting boron-doped spacers diffuse boron into the transition region upon substrate oxidation, thereby providing an increased concentration of dopant in the transition region. It will be apparent to those skilled in the art that the doped spacers described herein can be used for numerous other applications besides providing additional dopant in the transition region. For example, a channel stop or a diffusion pocket can be formed using the doped spacer fabrication method of the present invention.

In addition, it will be apparent to those skilled in the art that the method of the present invention may be easily modified for application to CMOS devices. In CMOS fabrication, field implant must be prevented form diffusing into the n-well region of a p-type semiconductor substrate. This may be accomplished by, for example, masking the n-well regions during ion implantation. Once the n-well region is masked from the field implant, the method of the present invention, described above, may be employed to increase the field implant at the transition region of the device.

While several embodiments of the present invention have been herein described, it will be apparent to those skilled in the art that modifications may be made without departing from the invention whose scope is defined by the following claims.

We claim:

1. A method for providing increased dopant concentration in selected regions of a semiconductor device, the semiconductor device having a field region, an active area and a transition region between the field region and the active area, said method comprising the following steps in the following order:
   forming an insulating layer on the surface of a semiconductor substrate;
   depositing an anti-oxidant layer on said insulating layer;
   selectively etching said anti-oxidant layer to provide an ion implant mask over the active area;
   ion-implanting the field region and the transition region of said semiconductor substrate;
   forming a set of first spacers on said insulating layer adjacent sides of said etched anti-oxidant layer and overlaying the transition region; and
   oxidizing said semiconductor substrate, thereby providing increased concentration of ion-implant at the transition region.

2. The method according to claim 1, further comprising, after the step of depositing said anti-oxidant layer, the steps of depositing a photoresist layer and lithographically defining the active area of the device.

3. The method according to claim 1, wherein said layer of photoresist is thicker than each of said insulating layer and said anti-oxidant layer.

4. The method according to claim 1, wherein said insulating layer consists of silicon oxide.

5. The method according to claim 1, wherein said first spacers consist of silicon nitride.

6. The method according to claim 1, wherein the length of each of said first spacers is between 0.05 and 0.075 micrometers.

7. The method according to claim 2, further comprising, after the step of ion-implanting, the step of removing said photoresist layer.

8. The method according to claim 1, wherein the length of each of said spacers is between 0.05 and 0.075 micrometers.

9. The method according to claim 1, wherein said semiconductor substrate is p-type and includes at least one n-well region.

10. The method according to claim 1, further comprising, after the step of ion-implanting the field region of said semiconductor substrate, the step of forming a layer of spacer material, and wherein the step of forming said spacers comprises forming said spacers by ansiotropically etching said spacer material.

11. The method according to claim 1, wherein the active region and the transition region contain different dopants.

12. The method according to claim 1, wherein said set of first spacers consists of doped oxide whereby dopant is diffused into said substrate during said oxidizing step.

13. The method according to claim 1, further comprising, after the step of forming said first spacers, the step of forming a set of second spacers.

14. The method according to claim 13, wherein at least one of said sets of first and said second spacers consists of boron-doped oxide, whereby dopant is diffused into said substrate during said oxidizing step.

15. The method according to claim 13, wherein each of said first and second spacers is between 0.05 and 0.075 micrometers in length.

16. A method for providing increased dopant concentration in selected regions of a semiconductor device, comprising the steps of:
   growing a layer of silicon oxide on the surface of a semiconductor substrate;
   depositing a layer of silicon nitride on the silicon oxide layer;
   depositing a layer of photoresist on the silicon nitride layer;
   etching the silicon nitride and said photoresist layers to define an active region of the semiconductor device;
   ion-implanting a field region and a transition region of said semiconductor substrate;
   removing said photoresist layer;
   depositing a first layer of silicon nitride spacer material;
   etching said silicon nitride spacer material to form first spacers on sides of the silicon nitride layer; and
   oxidizing said semiconductor substrate, except where masked by said silicon nitride layer and said first spacers.

17. The method according to claim 16, further comprising, after the step of etching said silicon nitride spacer material, the steps of:
   depositing a second layer of silicon nitride spacer material; and
   etching said second layer of silicon nitride spacer material to form, on the sides of said first spacers, second spacers as extensions of said first spacers.

* * * * *